US012581585B2

(12) United States Patent
Ishii et al.

(10) Patent No.: US 12,581,585 B2
(45) Date of Patent: Mar. 17, 2026

(54) TILT STAGE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Takuya Ishii, Oyama (JP); Yuto Tanaka, Oyama (JP); Shinichi Hagiwara, Oyama (JP)

(73) Assignee: Gigaphoton Inc., Tochigi (JP)

( * ) Notice: Subject to any disclaimer, the term of this patent is extended or adjusted under 35 U.S.C. 154(b) by 215 days.

(21) Appl. No.: 18/537,898

(22) Filed: Dec. 13, 2023

(65) Prior Publication Data
US 2024/0248416 A1 Jul. 25, 2024

(30) Foreign Application Priority Data
Jan. 24, 2023 (JP) ................................. 2023-009057

(51) Int. Cl.
*H05G 2/00* (2006.01)
*G03F 7/00* (2006.01)

(52) U.S. Cl.
CPC ....... *H05G 2/0023* (2024.08); *G03F 7/70033* (2013.01)

(58) Field of Classification Search
CPC .. H05G 2/0023; H05G 2/006; G03F 7/70033; G03F 7/70758
See application file for complete search history.

(56) References Cited

U.S. PATENT DOCUMENTS

| | | | | | |
|---|---|---|---|---|---|
| 4,431,304 | A | * | 2/1984 | Mayer | G03F 7/70716 |
| | | | | | 355/53 |
| 6,085,473 | A | * | 7/2000 | Teramachi | F16F 15/02 |
| | | | | | 52/167.4 |
| 2010/0294958 | A1 | * | 11/2010 | Hayashi | H05G 2/0027 |
| | | | | | 250/504 R |
| 2012/0006237 | A1 | * | 1/2012 | Iguchi | F16C 29/046 |
| | | | | | 384/15 |
| 2012/0162755 | A1 | * | 6/2012 | Stroessner | G03F 1/84 |
| | | | | | 359/385 |
| 2013/0153792 | A1 | | 6/2013 | Baumgart et al. | |
| 2015/0179401 | A1 | | 6/2015 | Gambino et al. | |
| 2018/0138009 | A1 | * | 5/2018 | Sugaya | H01J 37/28 |
| 2020/0341389 | A1 | * | 10/2020 | Ito | G03F 7/70716 |
| 2021/0333716 | A1 | * | 10/2021 | Abe | G03F 7/70025 |

* cited by examiner

*Primary Examiner* — Steven H Whitesell
(74) *Attorney, Agent, or Firm* — Studebaker Brackett PLLC

(57) ABSTRACT

A tilt stage includes a mounting table on which a target supply device supplying a target to a predetermined region in a chamber is mounted, a rotation support portion supporting the mounting table rotatably about at least first and second axes, a first tilt support portion including a first ball and a first contact surface in contact with the first ball and supporting the mounting table, a first adjuster adjusting posture of the target supply device by moving one of the first ball and the first contact surface in a first direction, a second tilt support portion including a second ball and a second contact surface in contact with the first ball and supporting the mounting table, and a second adjuster adjusting the posture of the target supply device by moving one of the second ball and the second contact surface in a second direction.

19 Claims, 12 Drawing Sheets

<u>74</u>

744
743
Z X
Y
70    742    741
82

D1
26
Z X
Y
732  Ax3  262  Ax2  715  717  716
75
7 { 70
731
8 { 8x
8z
82
81
80
2
733    261    27    712    711

TILT STAGE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2023-009057, filed on Jan. 24, 2023, the entire contents of which are hereby incorporated by reference.

BACKGROUND

1. Technical Field

The present disclosure relates to a tilt stage, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: US Patent Application Publication No. 2010/0294958
Patent Document 2: US Patent Application Publication No. 2013/0153792
Patent Document 3: US Patent Application Publication No. 2015/0179401

SUMMARY

A tilt stage according to an aspect of the present disclosure includes a mounting table on which a target supply device, of an extreme ultraviolet light generation apparatus, configured to supply a target to a predetermined region in a chamber is mounted; a rotation support portion configured to support the mounting table rotatably about at least first and second axes; a first tilt support portion including a first ball and a first contact surface in contact with the first ball and supporting the mounting table; a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface; a second tilt support portion including a second ball and a second contact surface in contact with the first ball and supporting the mounting table; and a second adjuster configured to adjust the posture of the target supply device by moving one of the second ball and the second contact surface in a second direction that different is from both a direction perpendicular to the second contact surface and a direction parallel to the second contact surface so that the second ball rolls on the second contact surface.

An extreme ultraviolet light generation apparatus according to an aspect of the present disclosure includes a chamber, a target supply device configured to supply a target to a predetermined region in the chamber, and a tilt stage. Here, the tilt stage includes a mounting table on which the target supply device is mounted, a rotation support portion configured to support the mounting table rotatably about at least first and second axes, a first tilt support portion including a first ball and a first contact surface in contact with the first ball and supporting the mounting table, a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface, a second tilt support portion including a second ball and a second contact surface in contact with the first ball and supporting the mounting table, and a second adjuster configured to adjust the posture of the target supply device by moving one of the second ball and the second contact surface in a second direction that is different from both a direction perpendicular to the second contact surface and a direction parallel to the second contact surface so that the second ball rolls on the second contact surface.

An electronic device manufacturing method according to an aspect of the present disclosure includes generating extreme ultraviolet light using an extreme ultraviolet light generation apparatus, outputting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a chamber, a target supply device configured to supply a target to a predetermined region in the chamber, and a tilt stage. The tilt stage includes a mounting table on which the target supply device is mounted, a rotation support portion configured to support the mounting table rotatably about at least first and second axes, a first tilt support portion including a first ball and a first contact surface in contact with the first ball and supporting the mounting table, a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface, a second tilt support portion including a second ball and a second contact surface in contact with the first ball and supporting the mounting table, and a second adjuster configured to adjust the posture of the target supply device by moving one of the second ball and the second contact surface in a second direction that is different from both a direction perpendicular to the second contact surface and a direction parallel to the second contact surface so that the second ball rolls on the second contact surface.

An electronic device manufacturing method according to an aspect of the present disclosure includes inspecting a defect of a mask by irradiating the mask with extreme ultraviolet light generated by an extreme ultraviolet light generation apparatus, selecting a mask using a result of the inspection, and exposing and transferring a pattern formed on the selected mask onto a photosensitive substrate. Here, the extreme ultraviolet light generation apparatus includes a chamber, a target supply device configured to supply a target to a predetermined region in the chamber, and a tilt stage. The tilt stage includes a mounting table on which the target supply device is mounted, a rotation support portion configured to support the mounting table rotatably about at least first and second axes, a first tilt support portion including a first ball and a first contact surface in contact with the first ball and supporting the mounting table, a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface, a second tilt support portion including a second ball and a second contact surface in contact with the first ball and supporting the mounting table, and a second adjuster configured to adjust the posture of the target supply device by moving one of the second ball and the second contact surface in a second direction that is different from both a direction perpendicular to the second contact surface and a direction parallel to the second contact surface so that the second ball rolls on the second contact surface.

BRIEF DESCRIPTION OF THE DRAWINGS

Embodiments of the present disclosure will be described below merely as examples with reference to the accompanying drawings.

DESCRIPTION OF EMBODIMENTS

Figure 1:
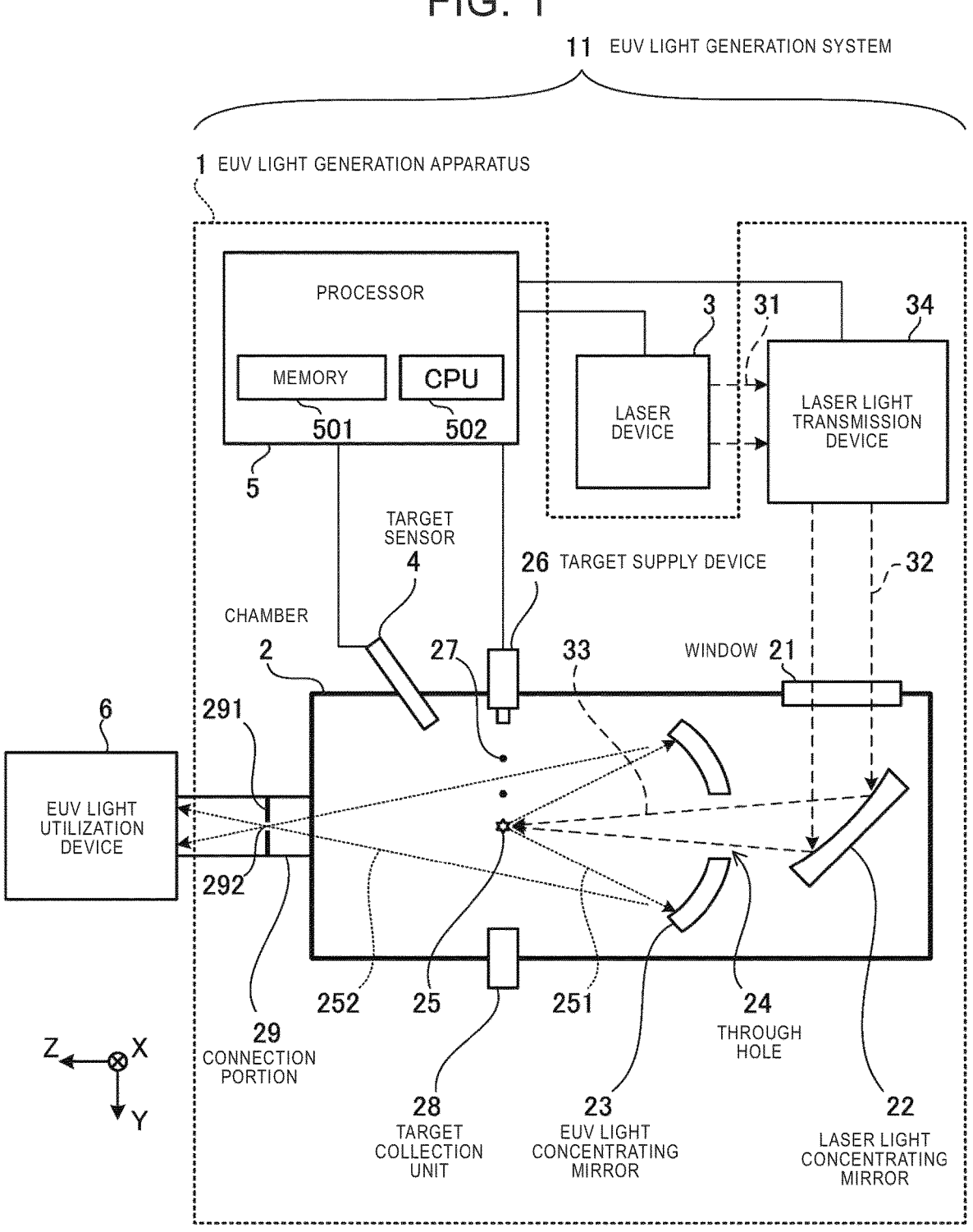
FIG. 1 schematically shows an exemplary configuration of an LPP EUV light generation system.

<Contents>
  1. Overall description of EUV light generation system 11
    1.1 Configuration
    1.2 Operation
  2. Comparative example
    2.1 Configuration
    2.2 Operation
    2.3 Problem of comparative example
  3. Tilt stage 7 that supports target supply device 26 with first, second, and third balls 711, 721, 731
    3.1 Configuration
      3.1.1 Rotation support portion 73
      3.1.2 First tilt support portion 71 and first adjuster 75
      3.1.3 Second tilt support portion 72 and second adjuster 76
      3.1.4 Guide mechanism 74
    3.2 Operation
    3.3 Modification
    3.4 Effect
  4. EUV light generation apparatus 1 that selectively uses tilt stage 7 and position stage 8
    4.1 Operation
    4.2 Effect
  5. Others
    5.1 Example of EUV light utilization apparatus 6
    5.2 Supplement Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 11

1.1 Configuration

FIG. 1 schematically shows an exemplary configuration of an LPP EUV light generation system 11. An EUV light generation apparatus 1 is used together with a laser device 3. In the present disclosure, a system including the EUV light generation apparatus 1 and the laser device 3 is referred to as the EUV light generation system 11. The EUV light generation apparatus 1 includes a chamber 2 and a target supply device 26. The chamber 2 is a sealable container. The target supply device 26 supplies a target 27 containing a target substance into the chamber 2. The material of the target substance may include tin, terbium, gadolinium, lithium, xenon, or a combination of any two or more thereof.

A through hole is formed in a wall of the chamber 2. The through hole is blocked by a window 21 and pulse laser light 32 output from the laser device 3 passes through the window 21. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24. The plasma generation region 25 corresponds to the predetermined region in the present disclosure.

The EUV light generation apparatus 1 includes a processor 5, a target sensor 4, and the like. The processor 5 is a processing device including a memory 501 in which a control program is stored, and a central processing unit (CPU) 502 which executes the control program. The processor 5 is specifically configured or programmed to perform various processes included in the present disclosure. The target sensor 4 detects at least one of the presence, trajectory, position, and velocity of the target 27. The target sensor 4 may have an imaging function.

Further, the EUV light generation apparatus 1 includes a connection portion 29 providing communication between the internal space of the chamber 2 and the internal space of an EUV light utilization apparatus 6. The EUV light utilization apparatus 6 may be an exposure apparatus 6a shown in FIG. 15 or an inspection apparatus 6b shown in FIG. 16. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulse laser light 31 output from the laser device 3 enters, via the laser light transmission device 34, the chamber 2 through the window 21 as the pulse laser light 32. The pulse laser light 32 travels along a laser light path in the chamber 2, is reflected by the laser light concentrating mirror 22, and is guided to the plasma generation region 25 as the pulse laser light 33.

The target supply device 26 outputs the target 27 toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light included in the radiation light 251 is reflected by the EUV light concentrating mirror 23 with higher reflectance than light in other wavelength ranges. Reflection light 252 including the EUV light reflected by the EUV light concentrating mirror 23 is concentrated at the intermediate focal point 292 and output to the EUV light utilization apparatus 6. Here, one target 27 may be irradiated with a plurality of pulses included in the pulse laser light 33. In the following description, the output direction of the EUV light is defined as the +Z direction, and the output direction of the target 27 is defined as the +Y direction. The +Z direction and the +Y direction are perpendicular to each other, and the directions perpendicular to both the +Z direction and the +Y direction are the +X direction and the −X direction.

The processor 5 controls the entire EUV light generation system 11. The processor 5 processes a detection result of the target sensor 4. Based on the detection result of the target sensor 4, the processor 5 controls the timing at which the target 27 is output, the output direction of the target 27, and the like. Further, the processor 5 controls oscillation timing of the laser device 3, a travel direction of the pulse laser light 32, the concentration position of the pulse laser light 33, and the like. The above-described various kinds of control are merely examples, and other control may be added as necessary.

2. Comparative Example 2.1 Configuration

Figure 2:
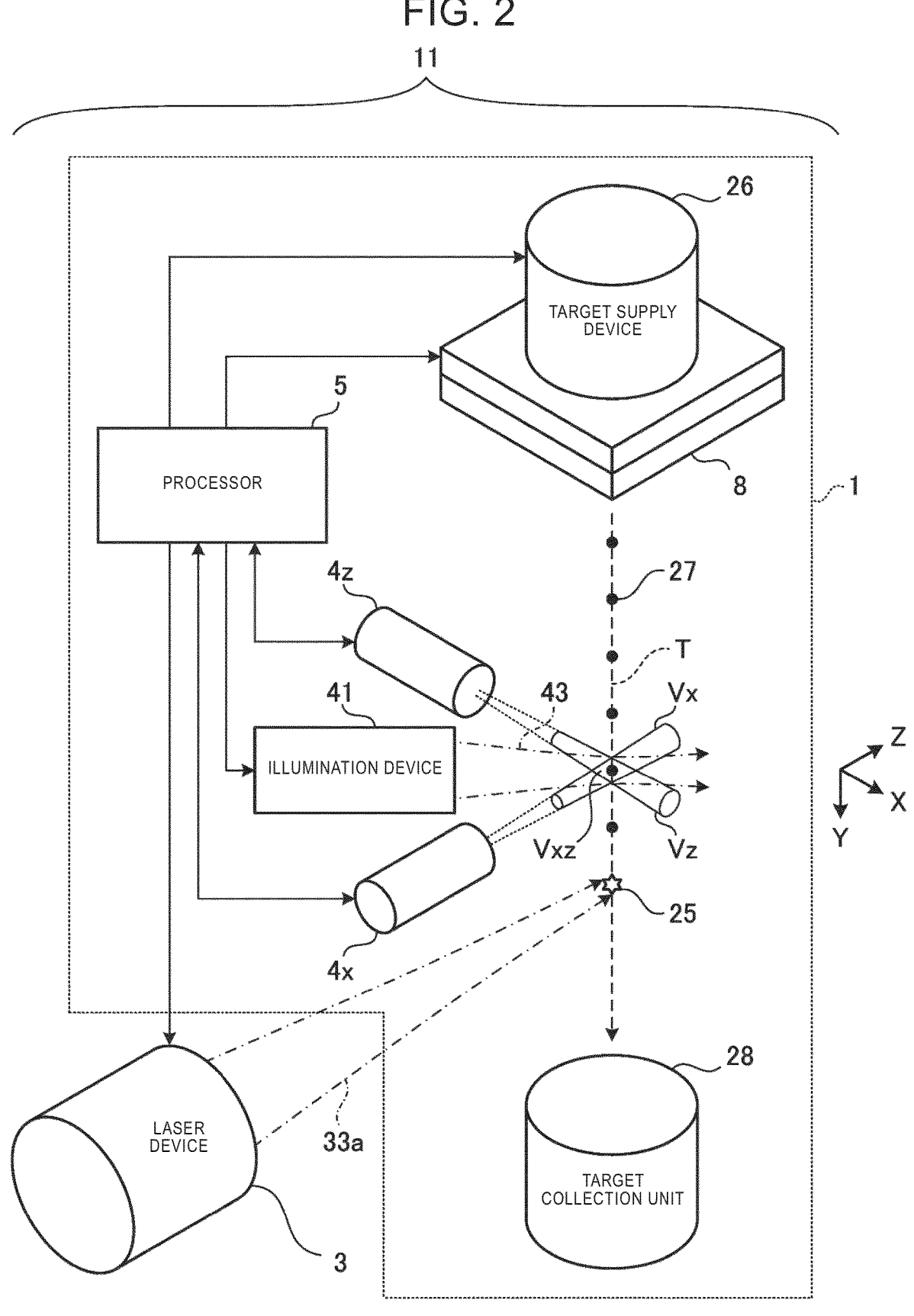
FIG. 2 schematically shows a part of the EUV light generation system according to a comparative example.

FIG. 2 schematically shows a part of the EUV light generation system 11 according to a comparative example. The comparative example of the present disclosure is an example recognized by the applicant as known only by the applicant, and is not a publicly known example admitted by the applicant. In FIG. 2, the chamber 2, the laser light concentrating mirror 22, the EUV light concentrating mirror 23, the laser light transmission device 34, and the like are omitted. As shown in FIG. 2, the EUV light generation apparatus 1 of the comparative example includes an X-axis trajectory sensor 4x, a Z-axis trajectory sensor 4z, an illumination device 41, and a position stage 8.

The X-axis trajectory sensor 4x, the Z-axis trajectory sensor 4z, and the illumination device 41 configure the target sensor 4 (see FIG. 1). Each of the X-axis trajectory sensor 4x and the Z-axis trajectory sensor 4z includes, for example, an imaging device, and is configured to generate image data by imaging the target 27 traveling from the target supply device 26 toward the plasma generation region 25.

The X-axis trajectory sensor 4x is arranged at a position substantially in the −Z direction when viewed from the trajectory T of the target 27, and detects the trajectory T of the target 27 from the position in the −Z direction. When the position of the trajectory T of the target 27 is shifted in the +X direction or the −X direction, the position of the image of the target 27 in the image obtained by the X-axis trajectory sensor 4x moves in the +X direction or the −X direction. Therefore, the processor 5 can calculate a detection position of the trajectory T on the X axis of the target 27 based on the image data output from the X-axis trajectory sensor 4x.

The Z-axis trajectory sensor 4z is arranged at a position substantially in the −X direction when viewed from the trajectory T of the target 27, and detects the trajectory T of the target 27 from the position in the −X direction. When the position of the trajectory T of the target 27 is shifted in the +Z direction or the −Z direction, the position of the image of the target 27 in the image obtained by the Z-axis trajectory sensor 4z moves in the +Z direction or the −Z direction. Therefore, the processor 5 can calculate a detection position of the trajectory T on the Z axis of the target 27 based on the image data output from the Z-axis trajectory sensor 4z.

Each of the X-axis trajectory sensor 4x and the Z-axis trajectory sensor 4z is arranged to image the target 27 in the vicinity of the plasma generation region 25, for example, the target 27 just before reaching the plasma generation region 25. The detection range Vx of the X-axis trajectory sensor 4x and the detection range Vz of the Z-axis trajectory sensor 4z are defined by the angle of view and the depth of focus determined by the optical system of these sensors. The detection range Vx of the X-axis trajectory sensor 4x and the detection range Vz of the Z-axis trajectory sensor 4z include a space Vxz in which the detection ranges Vx, Vz overlap each other. Each of the X-axis trajectory sensor 4x and the Z-axis trajectory sensor 4z is aligned such that the ideal trajectory of the target 27 from the target supply device 26 toward the plasma generation region 25 penetrates substantially the center of the space Vxz.

The illumination device 41 illuminates the target 27 with illumination light 43 that is laser light. The space Vxz is included in the optical path of the illumination light 43.

The position stage 8 is connected to the target supply device 26. The position stage 8 is configured to shift the trajectory T of the target 27 by changing the position of the target supply device 26 with respect to the plasma generation region 25. For example, the position stage 8 can shift the trajectory T of the target 27 in the X-axis direction and the Z-axis direction by moving the position of the target supply device 26 in the X-axis direction and the Z-axis direction.

2.2 Operation

The illumination device 41 generates the illumination light 43 under the control of the processor 5. When the target 27 passes through the space Vxz, the target 27 is illuminated with the illumination light 43.

Each of the X-axis trajectory sensor 4x and the Z-axis trajectory sensor 4z receives a part of the illumination light 43 reflected by the target 27. Each of the X-axis trajectory sensor 4x and the Z-axis trajectory sensor 4z images the target 27 illuminated by the illumination light 43 to generate image data, and outputs the image data to the processor 5. The timing of imaging by the X-axis trajectory sensor 4x and the Z-axis trajectory sensor 4z is controlled by the processor 5.

The processor 5 receives the image data from the X-axis trajectory sensor 4x and the Z-axis trajectory sensor 4z, and calculates the detection position of the trajectory T of the target 27 in each of the X axis and the Z axis. The processor 5 controls the position stage 8 based on the detection position in each of the X axis and the Z axis and the target position of the trajectory T of the target 27 in each of the X axis and the Z axis. That is, the processor 5 controls the position stage 8 in the X-axis direction and the Z-axis direction so that the trajectory T of the target 27 approaches the target position in each of the X axis and the Z axis. When the position stage 8 changes the position of the target supply device 26, the trajectory T of the target 27 to be output thereafter is shifted. Thus, the trajectory T of the target 27 is controlled so that the target 27 reaches the plasma generation region 25.

The laser device 3 may include a prepulse laser device and a main pulse laser device (not shown). Prepulse laser light output from the prepulse laser device is radiated to the target 27 and diffuse the target 27 to generate a diffusion target. Main pulse laser light output from the main pulse laser device is radiated to the diffusion target to turn the target substance contained in the diffusion target into plasma. One target 27 may be irradiated sequentially with a plurality of beams of the prepulse laser light from a plurality of the prepulse laser devices (not shown) to generate the diffusion target.

The X-axis trajectory sensor 4x or the Z-axis trajectory sensor 4z outputs a passage timing signal indicating timing at which the target 27 passes through a predetermined position on the Y axis. The processor 5 controls the laser device 3 to output laser light 33a based on the passage timing signal. Further, the processor 5 adjusts the concentration position of the laser light 33a on the Y axis by controlling the actuator of the laser light transmission device 34 based on the passage timing signal.

Further, the processor 5 adjusts the concentration position of the laser light 33a on the X axis by controlling the actuator of the laser light transmission device 34 based on the detection position of the trajectory T of the target 27 on the X axis.

2.3 Problem of Comparative Example

When the target supply device 26 is continuously operated, the target substance may adhere to the nozzle of the target supply device 26, and the trajectory T of the target 27 may be largely deviated. When the trajectory T of the target 27 is largely deviated, the trajectory T of the target 27 exceeds an adjustment margin of the trajectory T of the target 27 by the position stage 8, and the target 27 cannot be supplied to the plasma generation region 25.

In order to increase the adjustment margin of the trajectory T of the target 27, it is conceivable to provide a tilt stage to tilt the target supply device 26 and change the output direction of the target 27. However, it is difficult to realize a tilt stage that withstands the load of the target supply device 26. For example, it is conceivable to use an elastic hinge for a rotation shaft of the tilt stage, but the elastic hinge may not withstand a large load. Further, if the tilt stage has a portion where sliding friction occurs, seizure may occur on the friction surface when a large load is applied. Further, since the installation space of the tilt stage is limited, it is not preferable to adopt a complicated structure to improve the load resistance and the friction characteristics.

The embodiments described below relate to providing a tilt stage 7 that has a compact structure and can withstand a large load so that the trajectory T of the target 27 can be shifted by tilting the target supply device 26 of the EUV light generation apparatus 1.

3. Tilt Stage 7 that Supports Target Supply Device 26 with First, Second, and Third Balls 711, 721, 731

3.1 Configuration

Figure 3:
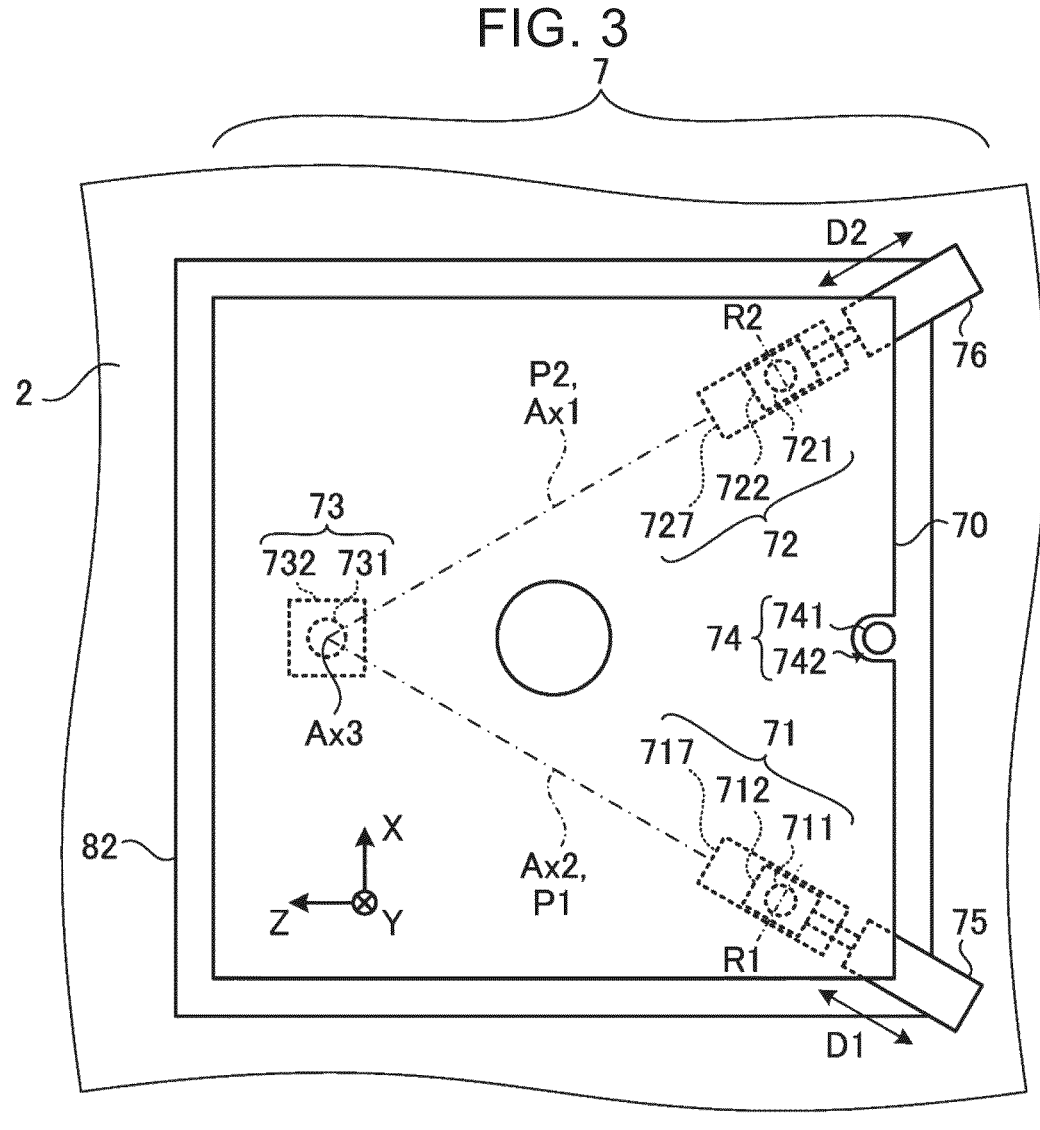
FIG. 3 is a plan view of a tilt stage in a first embodiment.
Figures 4, 5:
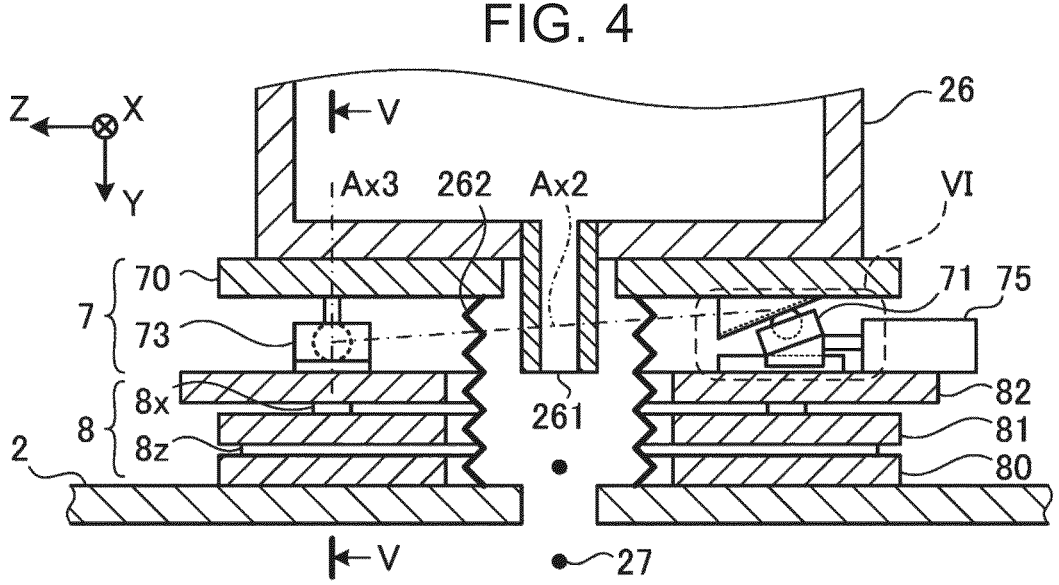
FIG. 4 is a side view of the tilt stage.
FIG. 5 is a sectional view of a rotation support portion.

FIG. 3 is a plan view of the tilt stage 7 of a first embodiment. FIG. 3 collectively shows an X-direction moving plate 82 on which the tilt stage 7 is mounted, and a part of the chamber 2. FIG. 4 is a side view of the tilt stage 7. FIG. 4 collectively shows a cross section of a part of the target supply device 26, a cross section of the position stage 8 including the X-direction moving plate 82, and a cross section of a part of the chamber 2. The position stage 8 is mounted on the chamber 2, the tilt stage 7 is mounted on the position stage 8, and the target supply device 26 is mounted on the tilt stage 7.

The position stage 8 includes a fixed plate 80, a Z-direction moving plate 81 mounted on the fixed plate 80, and the X-direction moving plate 82 mounted on the Z-direction moving plate 81. A Z-direction linear guide 8z is arranged between the fixed plate 80 and the Z-direction moving plate 81, and an X-direction linear guide 8x is arranged between the Z-direction moving plate 81 and the X-direction moving plate 82. Although the fixed plate 80 is fixed to the chamber 2, the load applied to the fixed plate 80 is not necessarily supported by the chamber 2. A member other than the chamber 2 may support the fixed plate 80 so that the positional relationship between the fixed plate 80 and chamber 2 does not change.

Each of the Z-direction linear guide 8z and the X-direction linear guide 8x includes an actuator (not shown) controlled by the processor 5 (see FIG. 1). The Z-direction moving plate 81 is movable in the Z-axis direction with respect to the fixed plate 80 by the Z-direction linear guide 8z, and the X-direction moving plate 82 is movable in the X-axis direction with respect to the Z-direction moving plate 81 by the X-direction linear guide 8x. Therefore, the X-direction moving plate 82 is movable in the Z-axis direction and the X-axis direction with respect to the fixed plate 80 by the Z-direction linear guide 8z and the X-direction linear guide 8x.

The tilt stage 7 includes a mounting table 70 on which the target supply device 26 is mounted, first and second tilt support portions 71, 72, a rotation support portion 73, a guide mechanism 74, and first and second adjusters 75, 76. The first and second tilt support portions 71, 72 and the rotation support portion 73 are located between the X-direction moving plate 82 and the mounting table 70 to support the mounting table 70.

The first tilt support portion 71, the second tilt support portion 72, and the rotation support portion 73 include a first ball 711, a second ball 721, and a third ball 731, respectively. The mounting table 70 is supported at three points of the first, second, and third balls 711, 721, 731. An axis connecting the upper end of the second ball 721 and the center of the third ball 731 is defined as a first axis Ax1, and an axis connecting the upper end of the first ball 711 and the center of the third ball 731 is defined as a second axis Ax2. An axis passing through the center of the third ball 731 and parallel to the Y-axis direction is defined as a third axis Ax3. The third axis Ax3 intersects both the first and second axes Ax1, Ax2.

The nozzle 261, which is a part of the target supply device 26, penetrates a through hole formed at the center of the mounting table 70. The nozzle 261 further penetrates a triangle having vertices at the respective centers of the first, second, and third balls 711, 721, 731.

The target 27 output from the nozzle 261 is supplied into the chamber 2 through the through hole of the chamber 2. A flexible tube 262 is connected between the through hole of the mounting table 70 and the through hole of the chamber 2. The pressure inside the flexible tube 262 is equivalent to the pressure inside the chamber 2 and is less than one fifth of the atmospheric pressure. The flexible tube 262 has strength to withstand pressure difference between the inside and outside thereof. The tilt stage 7 is loaded not only by the weight of the target supply device 26 but also by the atmospheric pressure.

3.1.1 Rotation Support Portion 73

FIG. 5 is a sectional view of the rotation support portion 73. FIG. 5 corresponds to a part of a cross section taken along line V-V of FIG. 4. The rotation support portion 73 is configured by a spherical bearing including the third ball 731 and a third socket 732. The third ball 731 is fixed to the mounting table 70 via a rod 733. The third socket 732 accommodates a part of the third ball 731 together with a plurality of in-socket rolling elements 73a to rotatably support the third ball 731. The in-socket rolling elements 73a roll between the third ball 731 and the third socket 732 to reduce friction therebetween. Being fixed to the X-direction moving plate 82, the third socket 732 is in a state of being fixed to the chamber 2 unless the position stage 8 is operated.

The third ball 731 is rotatable with three degrees of freedom inside the third socket 732. That is, it is rotatable about any of three axes perpendicular to one another. However, since the rotation about the third axis Ax3 has substantially no influence on the output direction of the target 27, the rotation around the third axis Ax3 may be suppressed. The mounting table 70 is rotatably supported with respect to at least the first and second axes Ax1, Ax2 (see FIG. 3).

3.1.2 First Tilt Support Portion 71 and First Adjuster 75

Figure 6:
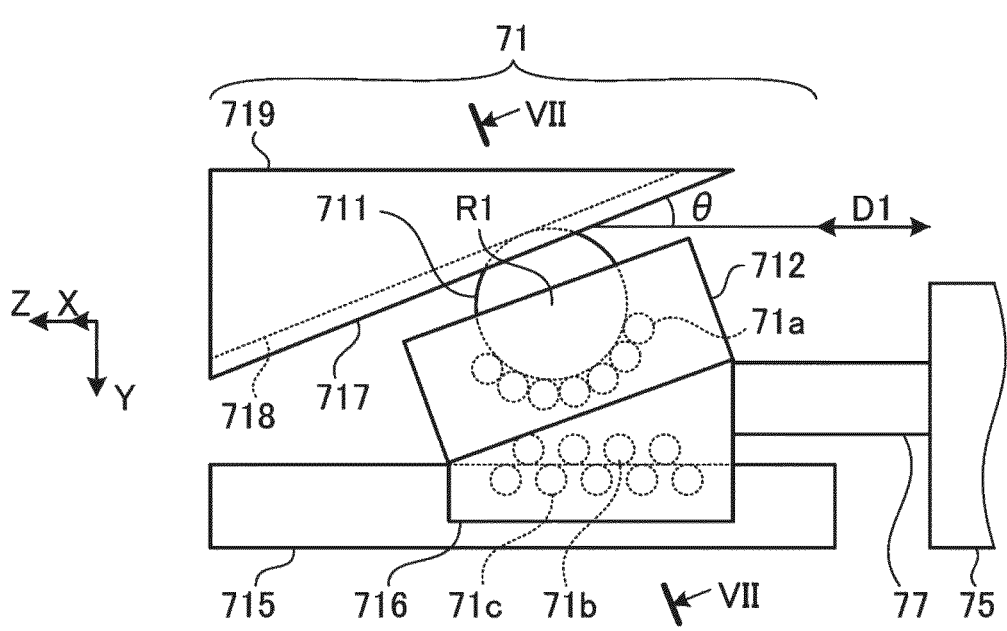
FIG. 6 is a side view of a first tilt support portion and a part of a first adjuster.
Figure 7:
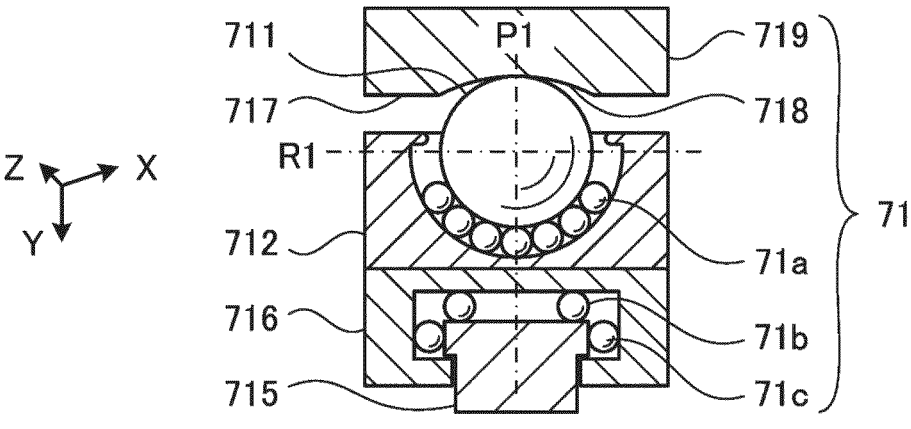
FIG. 7 is a sectional view taken along line VII-VII of FIG. 6.

FIG. 6 is a side view of the first tilt support portion 71 and a part of the first adjuster 75. FIG. 6 corresponds to the configuration in the vicinity of the enclosure line VI of FIG. 4 viewed in a direction parallel to a rotation axis R1 of the first ball 711 when the first ball 711 is moved in a first direction D1 by the first adjuster 75. That is, the direction of the line of sight in FIG. 6 is perpendicular to the first direction D1. FIG. 7 is a sectional view taken along line VII-VII of FIG. 6. FIG. 7 corresponds to a cross section perpendicular to the direction of a groove 718, which will be described later.

The first tilt support portion 71 includes the first ball 711, the first socket 712, a rail 715, a moving portion 716, an inclined member 719, a plurality of in-socket rolling elements 71a, and a plurality of linear guide rolling elements 71b, 71c. The first socket 712 accommodates a part of the first ball 711 together with the in-socket rolling elements 71a to rotatably support the first ball 711. The in-socket rolling elements 71a roll between the first ball 711 and the first socket 712 to reduce friction therebetween.

The rail 715 is arranged along the first direction D1 and is fixed to the X-direction moving plate 82 (see FIG. 4). The moving portion 716 moves along the rail 715 while supporting the first socket 712. The linear guide rolling elements 71b are arranged between the upper surface of the rail 715 and the moving portion 716, and the linear guide rolling elements 71c are arranged between the side surface of the rail 715 and the moving portion 716. The linear guide rolling elements 71b, 71c roll in the first direction D1 between the rail 715 and the moving portion 716 to reduce friction therebetween. The linear guide rolling elements 71b, 71c having rolled between the rail 715 and the moving portion 716 and having reached one end of the moving portion 716 are returned to the other end of the moving portion 716 through a circulation path (not shown) inside the moving portion 716.

The inclined member 719 is a member including a first contact surface 717 in contact with the first ball 711, and is fixed to the mounting table 70. The first direction D1 is a direction different from both a direction perpendicular to the first contact surface 717 and a direction parallel to the first contact surface 717. When the first ball 711 moves in a direction non-perpendicular to the first contact surface 717, the first ball 711 rolls on the first contact surface 717. When the first ball 711 moves in a direction non-parallel to the first contact surface 717, the first contact surface 717 moves in a movement direction including a Y-axis direction component. As described with reference to FIG. 3, since the mounting table 70 is supported at three points of the first, second, and third balls 711, 721, 731, the mounting table 70 rotates about the first axis Ax1 when the first contact surface 717 moves in the movement direction including the Y-axis direction component. It is desirable that an angle θ at which the first direction D1 and the first contact surface 717 intersect is less than 45°.

It is preferable that the first contact surface 717 has the groove 718 along a movement trajectory with respect to the first contact surface 717 when the first ball 711 rolls. Further, it is preferable that the radius of curvature of the groove 718 along the cross section perpendicular to the groove 718 is larger than the radius of curvature of the first ball 711. However, the first contact surface 717 may be a flat surface without the groove 718.

The first adjuster 75 is fixed to the X-direction moving plate 82 and is connected to the moving portion 716 via an adjustment rod 77. The first adjuster 75 includes an actuator (not shown) controlled by the processor 5 (see FIG. 1), and moves the moving portion 716 by advancing and retracting the adjustment rod 77 in the first direction D1. Alternatively, the first adjuster 75 may include a female screw fixed to the X-direction moving plate 82 and a male screw fixed to the adjustment rod 77, and may be configured to advance and retract the adjustment rod 77 by manually rotating the male screw with respect to the female screw.

When the first ball 711 presses the first contact surface 717, the mounting table 70 is preferably not subjected to a rotational force about the third axis Ax3 or the force is small. Assuming that the friction between the first ball 711 and the first contact surface 717 is zero, the first ball 711 presses the mounting table 70 in a direction perpendicular to the first contact surface 717. In practice, the friction is not zero, and the friction force including the direction component of the first direction D1 in which the first ball 711 moves also presses the mounting table 70. Therefore, the rotation of the mounting table 70 about the third axis Ax3 can be suppressed by arranging the rotation support portion 73 on a virtual plane P1 passing through the first ball 711 and being parallel to both the direction perpendicular to the first contact surface 717 and the first direction D1. Since the plane P1 is perpendicular to the rotation axis R1 of the first ball 711, the rotation support portion 73 may be arranged on the virtual plane P1 passing through the first ball 711 and being perpendicular to the rotation axis R1.

3.1.3 Second Tilt Support Portion 72 and Second Adjuster 76

The second tilt support portion 72 including the second ball 721, a second socket 722, a second contact surface 727, and the like, and the second adjuster 76 (see FIG. 3) will not be shown and description thereof will be omitted. The second tilt support portion 72 and the second adjuster 76 are similar to the first tilt support portion 71 and the first adjuster 75 except for being substantially mirror-symmetrical with respect to the first tilt support portion 71 and the first adjuster 75. The second ball 721 moves in a second direction D2 while rotating about a rotation axis R2 by the second adjuster 76. The rotation support portion 73 is located on a virtual plane P2 passing through the second ball 721 and being parallel to both the direction perpendicular to the second contact surface 727 and the second direction D2.

3.1.4 Guide Mechanism 74

Figure 8:
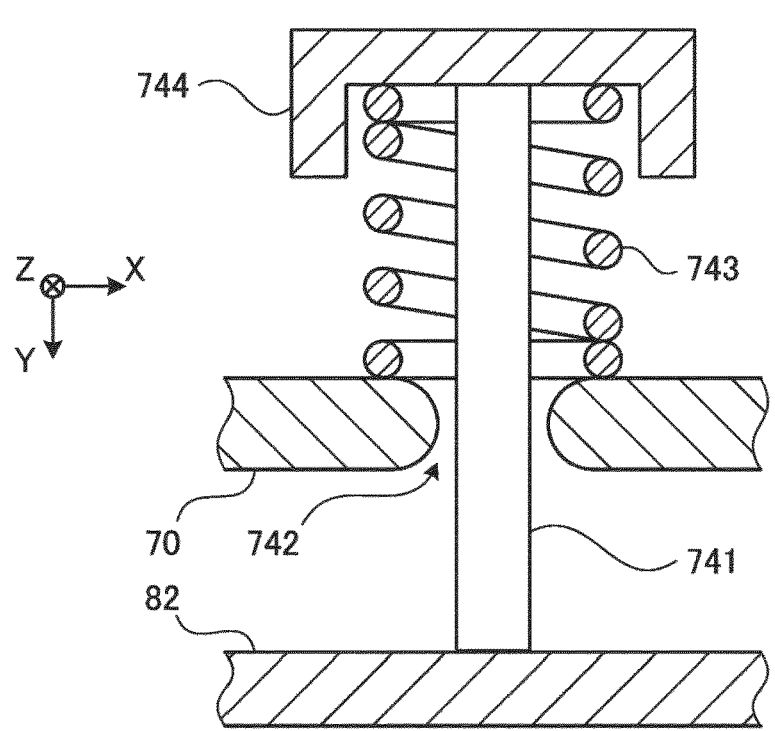
FIG. 8 is a sectional view of a guide mechanism.

FIG. 8 is a sectional view of the guide mechanism 74. The guide mechanism 74 includes a guide member 741, a spring 743, and a pressing member 744. The pressing member 744 is fixed so that the distance to the X-direction moving plate 82 is constant. The guide member 741 is a rod-shaped member with the upper end thereof fixed to the pressing member 744 and the lower end thereof fixed to the X-direction moving plate 82, and a portion between the upper end and the lower end is inserted to a notch 742 formed in the mounting table 70. Rotation of the mounting table 70 about the third axis Ax3 is restricted by the guide member 741.

The spring 743 presses the mounting table 70 downward to press one of the first ball 711 and the first contact surface 717 against the other. The spring 743 is a coil spring, and displacement of the spring 743 is suppressed by arranging the spring 743 so that the guide member 741 penetrates therethrough. The spring 743 may be arranged as a compression coil spring between the pressing member 744 and the mounting table 70, or may be arranged as a tension coil spring (not shown) between the mounting table 70 and the X-direction moving plate 82.

3.2 Operation

By operating the first tilt support portion 71, the mounting table 70 rotates about the first axis Ax1, and by operating the second tilt support portion 72, the mounting table 70 rotates about the second axis Ax2. By combining the operation of the first tilt support portion 71 and that of the second tilt support portion 72, the target supply device 26 can be tilted by rotating the mounting table 70 in any rotational direction other than rotation about an axis parallel to the Y axis. For example, when one of the first and second balls 711, 721 is moved in a direction approaching the third ball 731 and the other is moved in a direction away from the third ball 731, the mounting table 70 rotates about an axis parallel to the Z axis. When both of the first and second balls 711, 721 are moved in a direction approaching the third ball 731, or both thereof are moved in directions away from the third ball 731, the mounting table 70 rotates about an axis parallel to the X axis.

3.3 Modification

Figure 9:
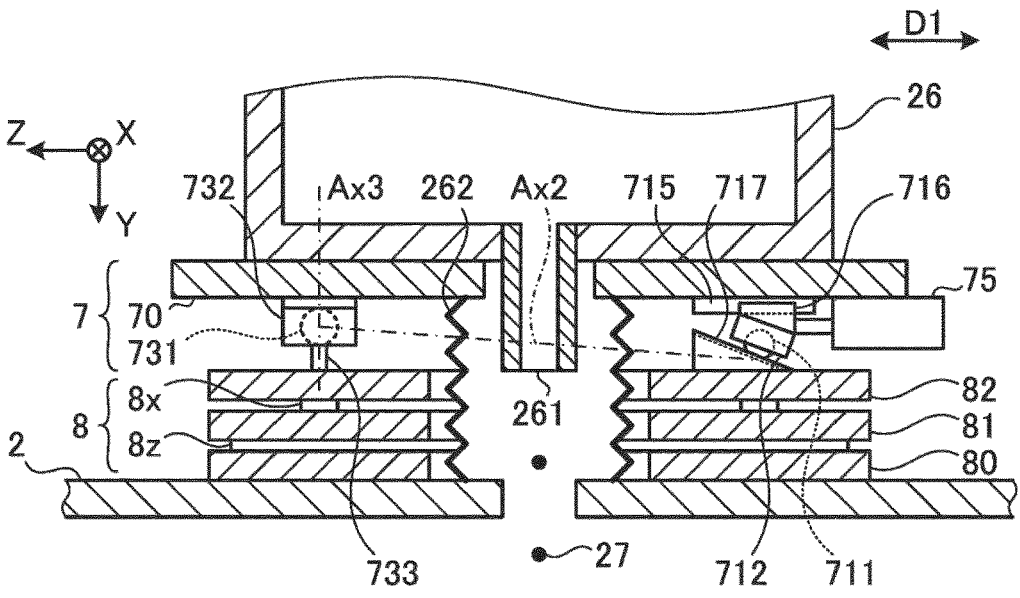
FIG. 9 is a side view of the tilt stage according to a first modification of the first embodiment.

FIG. 9 is a side view of the tilt stage 7 according to a first modification of the first embodiment. In FIG. 9, the components of the tilt stage 7 other than the mounting table 70 are upside down with respect to the configuration of FIG. 4. That is, the first ball 711 is supported by the mounting table 70 via the first socket 712, the rail 715, and the like to be movable in the first direction D1, and the first contact surface 717 is fixed to the X-direction moving plate 82. The third ball 731 may be fixed to the X-direction moving plate 82 via the rod 733, and the third socket 732 may be fixed to the mounting table 70.

Figure 10:
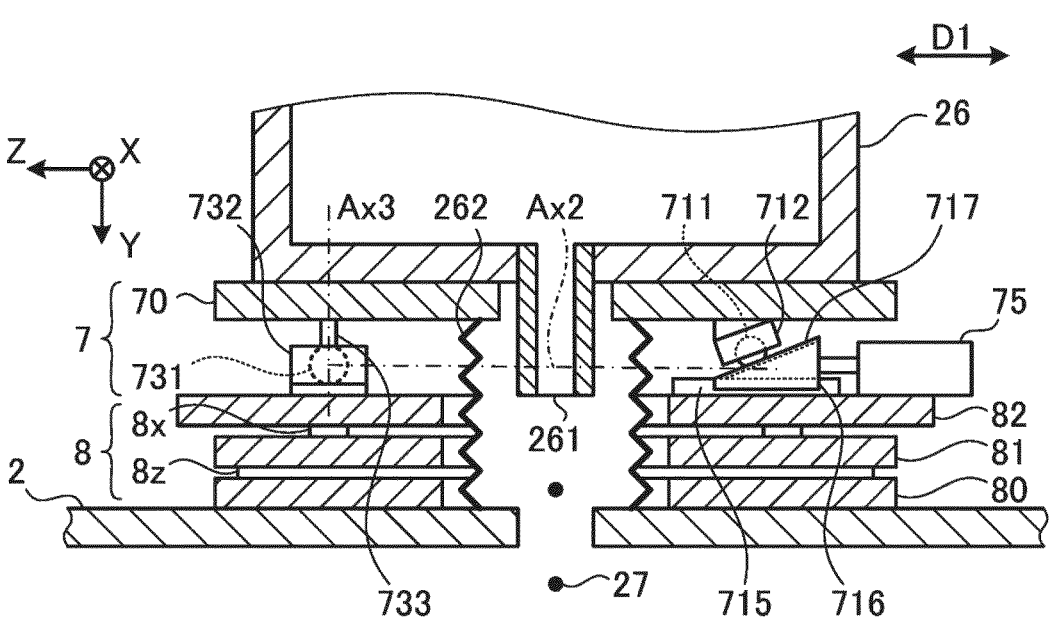
FIG. 10 is a side view of the tilt stage according to a second modification of the first embodiment.

FIG. 10 is a side view of the tilt stage 7 according to a second modification of the first embodiment. The configuration of FIG. 10 is different from the configuration of FIG. 4 in that the first ball 711 is fixed to the mounting table 70 via the first socket 712, and the first contact surface 717 is supported by the X-direction moving plate 82 via the rail 715 to be movable in the first direction D1.

Figure 11:
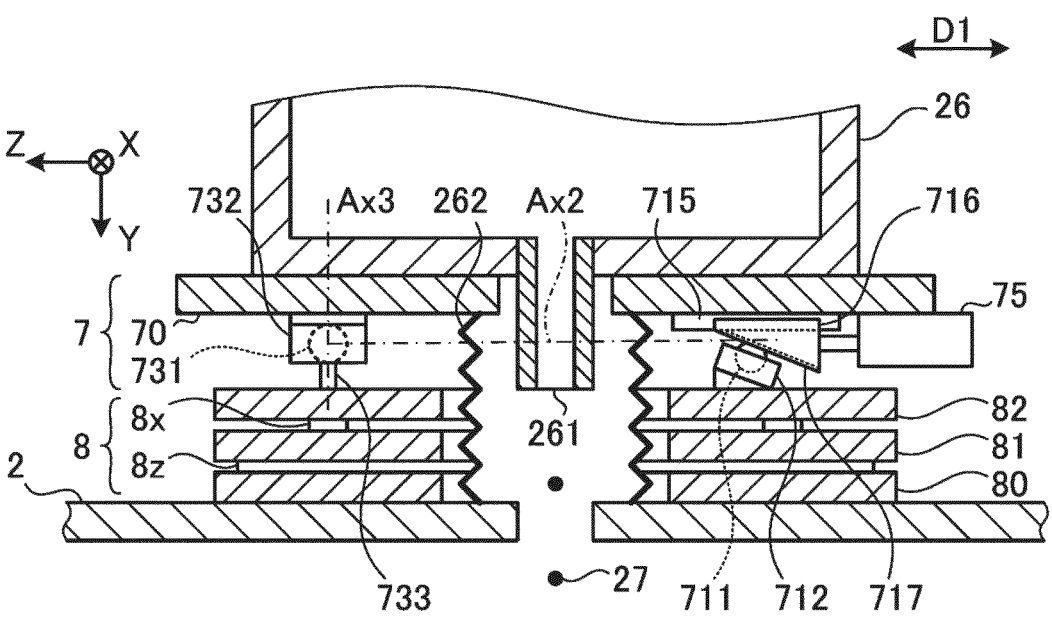
FIG. 11 is a side view of the tilt stage according to a third modification of the first embodiment.

FIG. 11 is a side view of the tilt stage 7 according to a third modification of the first embodiment. In FIG. 11, the components of the tilt stage 7 other than the mounting table 70 are upside down with respect to the configuration of FIG. 10. That is, the first ball 711 is fixed to the X-direction moving plate 82 via the first socket 712, and the first contact surface 717 is supported by the mounting table 70 via the rail 715 to be movable in the first direction D1. The third ball 731 may be fixed to the X-direction moving plate 82 via the rod 733, and the third socket 732 may be fixed to the mounting table 70.

3.4 Effect (1) In the first embodiment, the tilt stage 7 includes the mounting table 70, the rotation support portion 73, the first and second tilt support portions 71, 72, and the first and second adjusters 75, 76. The target supply device 26 of the EUV light generation apparatus 1 for supplying the target 27 to the plasma generation region 25 in the chamber 2 is mounted on the mounting table 70. The rotation support portion 73 rotatably supports the mounting table 70 about at least the first and second axes Ax1, Ax2. The first tilt support portion 71 includes the first ball 711 and the first contact surface 717 in contact with the first ball 711, and supports the mounting table 70. The first adjuster 75 adjusts the posture of the target supply device 26 by moving one of the first ball 711 and the first contact surface 717 in the first direction D1 that is different from both the direction perpendicular to the first contact surface 717 and the direction parallel to the first contact surface 717 so that the first ball 711 rolls on the first contact surface 717. The second tilt support portion 72 includes the second ball 721 and the second contact surface 727 in contact with the second ball 721, and supports the mounting table 70. The second adjuster 76 adjusts the posture of the target supply device 26 by moving one of the second ball 721 and the second contact surface 727 in the second direction D2 that is different from both the direction perpendicular to the second contact surface 727 and the direction parallel to the second contact surface 727 so that the second ball 721 rolls on the second contact surface 727.

Accordingly, by adjusting the posture of the target supply device 26 by the rolling of the first and second balls 711, 721 on the first and second contact surfaces 717, 727, friction in the first and second tilt support portions 71, 72 can be reduced, and seizure on the contact surface can be suppressed. Even when the deviation of the trajectory T of the target 27 exceeds the adjustment range of the position stage 8, the deviation of the trajectory T can be reduced by tilting the target supply device 26 to change the output direction of the target 27. Further, the tilt stage 7 can be configured with a simple configuration using the first and second tilt support portions 71, 72 and the rotation support portion 73, and the output direction of the target 27 can be changed without significantly increasing the installation space between the mounting table 70 and the chamber 2.

(2) In the first embodiment, a part of the first ball 711 is accommodated in the first socket 712, which is supported by one of the chamber 2 and the mounting table 70 to be movable in the first direction D1, together with the plurality of in-socket rolling elements 71a, such that the first ball 711 is rotatably supported, and the first contact surface 717 is fixed to the other of the chamber 2 and the mounting table 70.

Accordingly, a part of the first ball 711 is accommodated in the first socket 712 supported to be movable in the first direction D1, and the first contact surface 717 is fixed, whereby the first ball 711 can roll on the first contact surface 717 with a simple configuration. Further, the friction between the first ball 711 and the first socket 712 can be reduced by the in-socket rolling elements 71a.

(3) In the first embodiment, the first tilt support portion 71 further includes the rail 715 arranged in the first direction D1, the moving portion 716 that supports the first socket 712 and moves along the rail 715, and the plurality of linear guide rolling elements 71b, 71c arranged between the rail 715 and the moving portion 716.

Accordingly, it is possible to support the first socket 712 to be movable in the first direction D1 with a simple configuration. Further, the friction between the rail 715 and the moving portion 716 can be reduced by the linear guide rolling elements 71b, 71c.

(4) In the first embodiment, a part of the first ball 711 is accommodated in the first socket 712, which is fixed to one of the chamber 2 and the mounting table 70, together with the plurality of in-socket rolling elements 71a, such that the first ball 711 is rotatably supported, and the first contact surface 717 is supported by the other of the chamber 2 and the mounting table 70 to be movable in the first direction D1.

Accordingly, a part of the first ball 711 is accommodated in the fixed first socket 712, and the first contact surface 717 is supported to be movable in the first direction D1, whereby the first ball 711 can roll on the first contact surface 717 with a simple configuration. Further, the friction between the first ball 711 and the first socket 712 can be reduced by the in-socket rolling elements 71a.

(5) In the first embodiment, the first tilt support portion 71 further includes the rail 715 arranged in the first direction D1, the moving portion 716 that supports the first contact surface 717 and moves along the rail 715, and the plurality of linear guide rolling elements 71b, 71c arranged between the rail 715 and the moving portion 716.

Accordingly, the first contact surface 717 can be supported to be movable in the first direction D1 with a simple configuration. Further, the friction between the rail 715 and the moving portion 716 can be reduced by the linear guide rolling elements 71b, 71c.

(6) In the first embodiment, a part of the second ball 721 is accommodated in the second socket 722, which is supported by one of the chamber 2 and the mounting table 70, together with the plurality of in-socket rolling elements (not shown), such that the second ball 721 is rotatably supported, and the second contact surface 727 is supported by the other of the chamber 2 and the mounting table 70.

Accordingly, the friction between the second ball 721 and the second socket 722 can be reduced by the in-socket rolling elements.

(7) In the first embodiment, the first contact surface 717 and the first direction D1 intersect at the angle θ less than 45°.

Accordingly, even when the force for moving one of the first ball 711 and the first contact surface 717 in the first direction D1 is smaller than the force for pressing the first ball 711 and the first contact surface 717 against each other, the posture of the target supply device 26 can be adjusted by driving the first tilt support portion 71.

(8) In the first embodiment, the first contact surface 717 includes the groove 718 along the movement trajectory of the first ball 711 with respect to the first contact surface 717 when one of the first ball 711 and the first contact surface 717 is moved by the first adjuster 75.

Accordingly, by providing the groove 718, the pressure applied to the contact surface between the first ball 711 and the first contact surface 717 can be reduced, and deformation of the contact surface can be suppressed. Further, the first ball 711 is likely to stay in the groove 718, and the mounting table 70 can be suppressed from rotating about the third axis Ax3 intersecting the first and second axes Ax1, Ax2.

(9) In the first embodiment, the radius of curvature of the groove 718 along the cross section taken along line VII-VII perpendicular to the groove 718 is larger than the radius of curvature of the first ball 711.

Accordingly, by making the radius of curvature of the groove 718 larger than the radius of curvature of the first ball 711, occurrence of sliding friction between the first ball 711 and the first contact surface 717 can be suppressed.

(10) In the first embodiment, the rotation support portion 73 is located in the plane P1 passing through the first ball 711 and being parallel to both the direction perpendicular to the first contact surface 717 and the first direction D1.

Accordingly, by arranging the rotation support portion 73 on the plane P1 parallel to both the direction perpendicular to the first contact surface 717 and the first direction D1, rotation of the mounting table 70 about the third axis Ax3 can be suppressed.

(11) In the first embodiment, the rotation support portion 73 is located on the plane P1 passing through the first ball 711 and being perpendicular to the rotation axis R1 of the first ball 711 when the first adjuster 75 moves one of the first ball 711 and the first contact surface 717.

Accordingly, by arranging the rotation support portion 73 on the plane P1 perpendicular to the rotation axis R1 of the first ball 711, rotation of the mounting table 70 about the third axis Ax3 can be suppressed.

(12) In the first embodiment, the rotation support portion 73 is configured by the spherical bearing including the third ball 731 fixed to one of the chamber 2 and the mounting table 70, and the third socket 732 fixed to the other of the chamber 2 and the mounting table 70 and accommodating a part of the third ball 731 together with the plurality of in-socket rolling elements 73*a* to rotatably support the third ball 731.

Accordingly, since a part of the third ball 731 is accommodated in the third socket 732, it is possible to rotatably support the mounting table 70 with respect to at least the first and second axes Ax1, Ax2 with a simple configuration. Further, the friction between the third ball 731 and the third socket 732 can be reduced by the in-socket rolling elements 73*a*.

(13) In the first embodiment, the first, second, and third balls 711, 721, 731 are arranged such that a part of the target supply device 26 penetrates a triangle with the centers of the first, second, and third balls 711, 721, 731 as apexes.

Accordingly, it is possible to suppress interference with the installation space of the target supply device 26 when the first and second tilt support portions 71, 72 and the rotation support portion 73 are arranged. In addition, the weight of the target supply device 26 may be supported at three points around the target supply device 26 in a well-balanced manner.

(14) In the first embodiment, the tilt stage 7 includes the guide member 741 that restricts the rotation of the mounting table 70 with respect to the third axis Ax3 intersecting both the first and second axes Ax1, Ax2.

Accordingly, the rotation of the mounting table 70 about the third axis Ax3 can be suppressed not only at the time of adjustment of the tilt stage 7 but also at the time of transporting.

(15) In the first embodiment, the tilt stage 7 includes the spring 743 that presses one of the first ball 711 and the first contact surface 717 against the other thereof.

Accordingly, it is possible to suppress rattling of the mounting table 70 and stably hold the mounting table 70 at the time of transporting the tilt stage 7 or the like.

(16) In the first embodiment, the EUV light generation apparatus 1 includes the chamber 2, the target supply device 26 that supplies the target 27 to the plasma generation region 25 in the chamber 2, and the tilt stage 7.

Accordingly, the trajectory T of the target 27 can be changed by tilting the target supply device 26 of the EUV light generation apparatus 1. The tilt stage 7 described above has a compact structure and can withstand a large load.

In other respects, the first embodiment is similar to the comparative example.

4. EUV Light Generation Apparatus 1 that Selectively Uses Tilt Stage 7 and Position Stage 8

4.1 Operation

Figure 12:
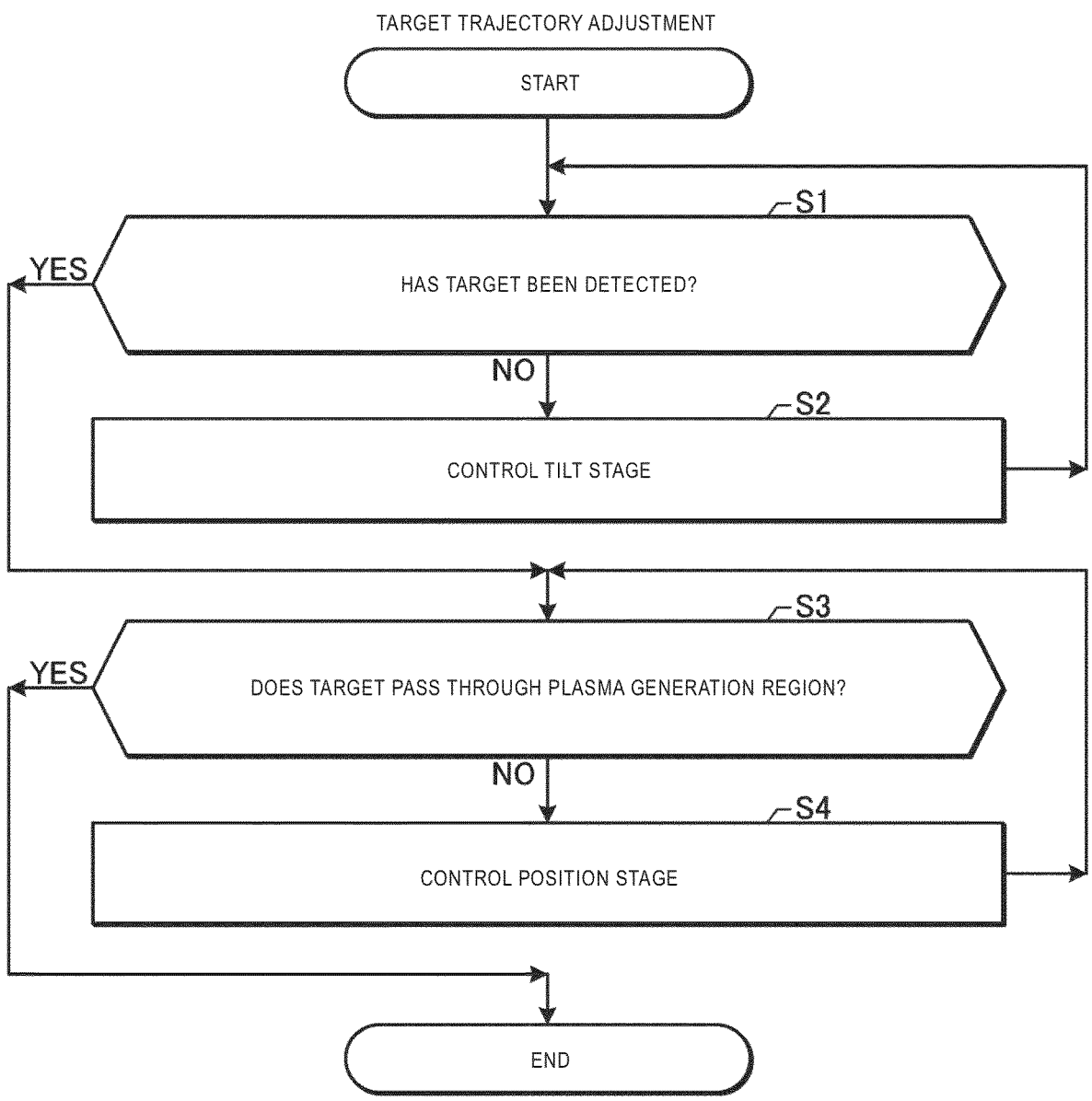
FIG. 12 is a flowchart showing operation of performing target trajectory adjustment in a second embodiment.

FIG. 12 is a flowchart showing operation of performing target trajectory adjustment in a second embodiment. The physical configuration of the EUV light generation apparatus 1 according to the second embodiment is similar to that of the first embodiment.

In S1, the processor 5 determines whether or not the target 27 has been detected by the target sensor 4. When the target 27 has been detected (S1: YES), the processor 5 advances processing to S3. When the target 27 has not been detected (S1: NO), the processor 5 advances processing to S2.

In S2, the processor 5 controls the tilt stage 7 to change the output direction of the target 27, and then returns processing to S1.

Figure 13:
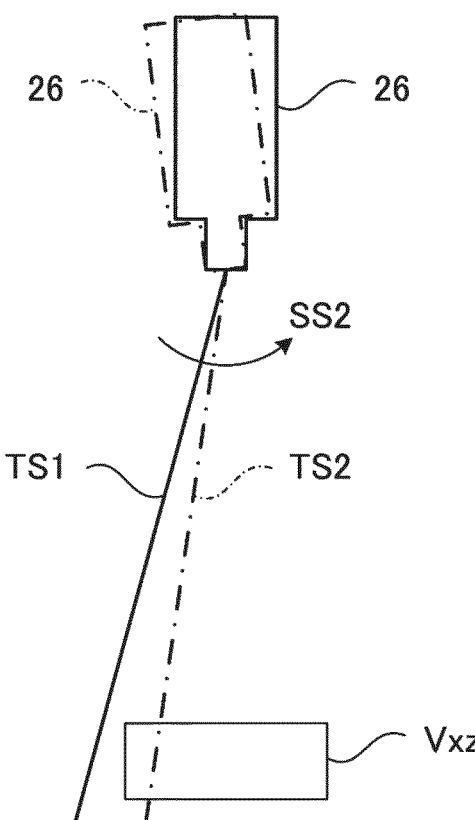
FIG. 13 shows a posture of a target supply device and a trajectory of a target in S1 and S2 of FIG. 12.

FIG. 13 shows the posture of the target supply device 26 and trajectories TS1, TS2 of the target 27 in S1 and S2 of FIG. 12, respectively. When the trajectory TS1 of the target 27 does not pass through the space Vxz that can be detected by the target sensor 4 in S1, the processor 5 changes the posture of the target supply device 26 in the direction of the arrow SS2 in S2, thereby changing the output direction of the target 27. As a result, in a case that the trajectory TS2 of the target 27 passes through the space Vxz, processing proceeds to S3. Here, the process in S2 is intended to control the posture of the target supply device 26 such that the trajectory TS2 of the target 27 passes somewhere through the space Vxz, and is not intended to make the trajectory TS2 of the target 27 pass through the optimum position in the space Vxz. As described above, the control of the tilt stage 7 is responsible for the coarse adjustment of the trajectory T of the target 27.

Referring again to FIG. 12, in S3, the processor 5 determines whether or not the target 27 passes through the plasma generation region 25. When the target 27 passes through the plasma generation region 25 (S3: YES), the processor 5 ends processing of the present flowchart. When the target 27 does not pass through the plasma generation region 25 (S3:NO), the processor 5 advances processing to S4.

In S4, the processor 5 controls the position stage 8 based on the detection result of the target sensor 4, and then returns processing to S3.

Figure 14:
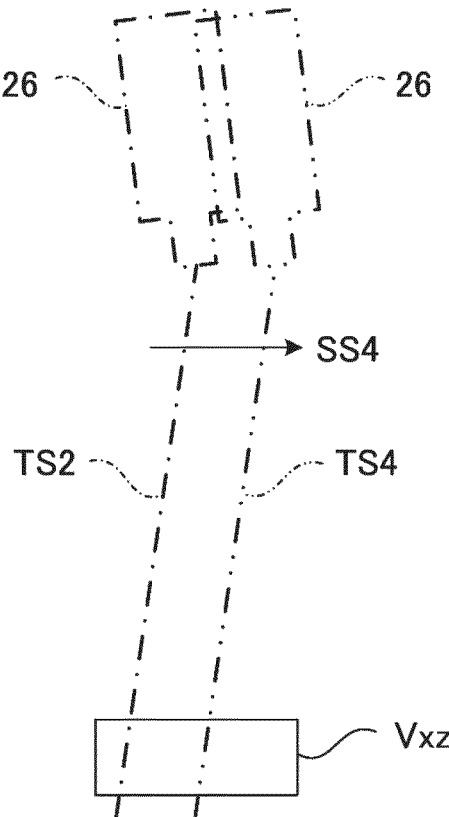
FIG. 14 shows a position of the target supply device and a trajectory of the target in S3 and S4 of FIG. 12.

FIG. 14 shows the position of the target supply device 26 and trajectories TS2, TS4 of the target 27 in S3 and S4 of FIG. 12, respectively. When the trajectory TS2 of the target 27 passes through the space Vxz in S3 but does not pass through the optimum position in the space Vxz, the processor 5 changes the position of the target supply device 26 in the direction of the arrow SS4 in S4 to translate the trajectory TS2 of the target 27 to the trajectory TS4. As a result, in a case that the trajectory TS4 of the target 27 passes through the optimum position in the space Vxz, it is determined that the target 27 passes through the plasma generation region 25, and processing of the flowchart of FIG. 12 is ended. The optimum position in the space Vxz varies depending on the output direction of the target 27 but, for example, the position being the center of the space Vxz when viewed from the X direction as well as from the Z direction is the optimum position. Thus, the control of the position stage 8 is responsible for the fine adjustment of the trajectory T of the target 27.

4.2 Effect

(17) In the second embodiment, the EUV light generation apparatus 1 includes the position stage 8 that adjusts the position of the target supply device 26, the target sensor 4 that detects the trajectory T of the target 27, and the processor 5 that performs the coarse adjustment of the trajectory T of the target 27 by controlling the tilt stage 7 based on the detection result of the target sensor 4 and performs the fine adjustment of the trajectory T of the target 27 by controlling the position stage 8 based on the detection result.

Accordingly, since the tilt stage 7 performs the coarse adjustment, it is not necessary to adopt a configuration in which the trajectory T of the target 27 can be precisely controlled in units of μm, for example. Therefore, it is possible to reduce the necessity of f complicating the configuration of the tilt stage 7.

(18) In the second embodiment, the EUV light generation apparatus 1 includes the position stage 8 that adjusts the position of the target supply device 26, the target sensor 4 that detects the trajectory T of the target 27, and the processor 5 that controls the tilt stage 7 when the target sensor 4 has not detected the trajectory T of the target 27 and controls the position stage 8 when the target sensor 4 has detected the trajectory T of the target 27.

Accordingly, even when the target sensor 4 cannot detect the trajectory T of the target 27, the trajectory T can be changed by the tilt stage 7 so that the target sensor 4 can detect the trajectory T, and when the target sensor 4 can detect the trajectory T, the trajectory T can be controlled to an ideal position by the position stage 8.

In other respects, the second embodiment is similar to the first embodiment.

5. Others

5.1 Example of EUV Light Utilization Apparatus 6

Figure 15:
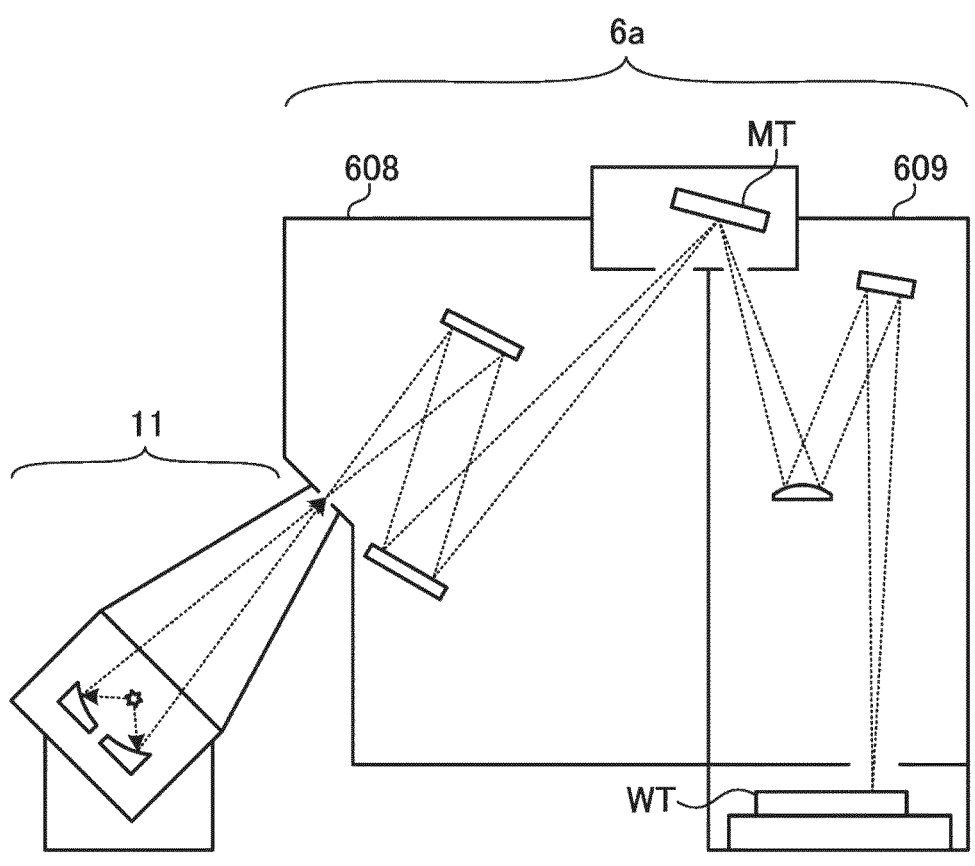
FIG. 15 schematically shows the configuration of an exposure apparatus connected to the EUV light generation system.

FIG. 15 schematically shows the configuration of an exposure apparatus 6a connected to the EUV light generation system 11.

In FIG. 15, the exposure apparatus 6a as the EUV light utilization apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11. The workpiece irradiation unit 609 images the EUV light reflected by the mask table MT onto a workpiece (not shown) arranged on a workpiece table WT via a reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 16:
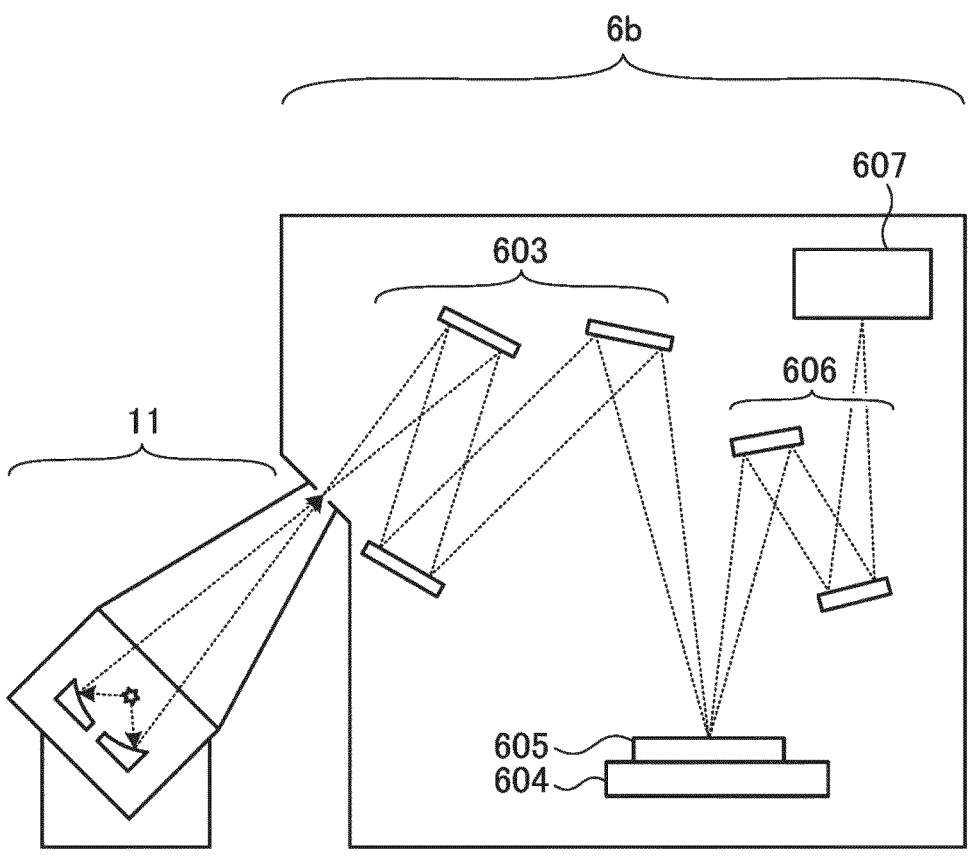
FIG. 16 schematically shows the configuration of an inspection apparatus connected to the EUV light generation system.

FIG. 16 schematically shows the configuration of an inspection apparatus 6b connected to the EUV light generation system 11.

In FIG. 16, the inspection apparatus 6b as the EUV light utilization apparatus 6 (see FIG. 1) includes an illumination optical system 603 and a detection optical system 606. The illumination optical system 603 reflects the EUV light incident from the EUV light generation system 11 to illuminate a mask 605 placed on a mask stage 604. Here, the mask 605 conceptually includes a mask blanks before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) camera. A defect of the mask 605 is inspected based on the image of the mask 605 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6a.

5.2 Supplement

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A tilt stage comprising:
   a mounting table on which a target supply device, of an extreme ultraviolet light generation apparatus, configured to supply a target to a predetermined region in a chamber is mounted;
   a rotation support portion configured to support the mounting table rotatably about at least first and second axes;
   a first tilt support portion including a first ball and a first contact surface in contact with the first ball and supporting the mounting table;
   a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface;
   a second tilt support portion including a second ball and a second contact surface in contact with the second ball and supporting the mounting table; and
   a second adjuster configured to adjust the posture of the target supply device by moving one of the second ball and the second contact surface in a second direction that is different from both a direction perpendicular to the second contact surface and a direction parallel to the second contact surface so that the second ball rolls on the second contact surface,
   wherein the rotation support portion includes a third ball, a relative position of the third ball with respect to the chamber is fixed, and a relative position of the third ball with respect to the mounting table is fixed, and
   the rotation support portion is intersected by both a first virtual plane, which passes through the first ball and is parallel to both a direction perpendicular to the first contact surface and the first direction, and a second virtual plane, which passes through the second ball and is parallel to both a direction perpendicular to the second contact surface and the second direction.

2. The tilt stage according to claim 1,
   wherein a part of the first ball is accommodated in a first socket which is supported by one of the chamber and the mounting table to be movable in the first direction together with a plurality of in-socket rolling elements such that the first ball is rotatably supported, and
   the first contact surface is fixed to the other of the chamber and the mounting table.

3. The tilt stage according to claim 2,
   wherein the first tilt support portion further includes a rail arranged in the first direction, a moving portion that supports the first socket and moves along the rail, and a plurality of linear guide rolling elements arranged between the rail and the moving portion.

4. The tilt stage according to claim 1,
   wherein a part of the first ball is accommodated in a first socket which is fixed to one of the chamber and the mounting table together with a plurality of in-socket rolling elements such that the first ball is rotatably supported, and the first contact surface is supported by the other of the chamber and the mounting table to be movable in the first direction.

5. The tilt stage according to claim 4, wherein the first tilt support portion further includes a rail arranged in the first direction, a moving portion that supports the first contact surface and moves along the rail, and a plurality of linear guide rolling elements arranged between the rail and the moving portion.

6. The tilt stage according to claim 1, wherein a part of the second ball is accommodated in a second socket which is supported by one of the chamber and the mounting table together with a plurality of in-socket rolling elements such that the second ball is rotatably supported, and the second contact surface is supported by the other of the chamber and the mounting table.

7. The tilt stage according to claim 1, wherein the first contact surface and the first direction intersect at an angle less than 45°.

8. The tilt stage according to claim 1, wherein the first contact surface includes a groove along a movement trajectory of the first ball with respect to the first contact surface when one of the first ball and the first contact surface is moved by the first adjuster.

9. The tilt stage according to claim 8, wherein a radius of curvature of the groove along a cross section perpendicular to the groove is larger than a radius of curvature of the first ball.

10. The tilt stage according to claim 1, wherein the first virtual plane is perpendicular to a rotation axis of the first ball when the first adjuster moves one of the first ball and the first contact surface.

11. The tilt stage according to claim 1, wherein the rotation support portion is configured by a spherical bearing including the third ball, and a third socket accommodating a part of the third ball together with a plurality of in-socket rolling elements to rotatably support the third ball.

12. The tilt stage according to claim 11, wherein the first, second, and third balls are arranged such that a part of the target supply device penetrates a triangle with centers of the first, second, and third balls as apexes.

13. The tilt stage according to claim 1, further comprising a guide member that restricts rotation of the mounting table with respect to a third axis intersecting both the first and second axes.

14. The tilt stage according to claim 1, further comprising a spring that presses one of the first ball and the first contact surface against the other thereof.

15. An extreme ultraviolet light generation apparatus comprising:

a chamber;

a target supply device configured to supply a target to a predetermined region in the chamber;

a position stage configured to adjust a position of the target supply device;

a target sensor configured to detect a trajectory of the target;

a processor; and a tilt stage, the tilt stage including:

a mounting table on which the target supply device is mounted;

a rotation support portion configured to support the mounting table rotatably about at least first and second axes;

a first tilt support portion including a first ball and a first contact surface in contact with the first ball and supporting the mounting table;

a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface;

a second tilt support portion including a second ball and a second contact surface in contact with the second ball and supporting the mounting table; and a second adjuster configured to adjust the posture of the target supply device by moving one of the second ball and the second contact surface in a second direction that is different from both a direction perpendicular to the second contact surface and a direction parallel to the second contact surface so that the second ball rolls on the second contact surface, wherein the rotation support portion includes a third ball, a relative position of the third ball with respect to the chamber is fixed, and a relative position of the third ball with respect to the mounting table is fixed, and the processor performs coarse adjustment of the trajectory of the target by controlling the tilt stage based on a detection result of the target sensor and performs fine adjustment of the trajectory of the target by controlling the position stage based on the detection result.

16. The extreme ultraviolet light generation apparatus according to claim 15, wherein the processor controls the tilt stage when the target sensor has not detected the trajectory of the target and subsequently, when the target sensor has detected the trajectory of the target, controls the position stage based on the trajectory detected by the target sensor.

17. The extreme ultraviolet light generation apparatus according to claim 15, further comprising a flexible tube connected between a through hole of the mounting table and a through hole of the chamber, wherein a nozzle of the target supply device penetrates the through hole of the mounting table into the flexible tube.

18. An electronic device manufacturing method, comprising:

generating extreme ultraviolet light using an extreme ultraviolet light generation apparatus;

outputting the extreme ultraviolet light to an exposure apparatus; and exposing a photosensitive substrate to the extreme ultraviolet light in the exposure apparatus to manufacture an electronic device, the extreme ultraviolet light generation apparatus including:

a chamber;

a target supply device configured to supply a target to a predetermined region in the chamber; and a tilt stage, the tilt stage including:

a mounting table on which the target supply device is mounted;

a rotation support portion configured to support the mounting table rotatably about at least first and second axes;

a first tilt support portion including a first ball and a first contact surface in contact with the first ball and supporting the mounting table;

a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface;

a second tilt support portion including a second ball and a second contact surface in contact with the second ball and supporting the mounting table; and a second adjuster configured to adjust the posture of the target supply device by moving one of the second ball and the second contact surface in a second direction that is different from both a direction perpendicular to the second contact surface and a direction parallel to the second contact surface so that the second ball rolls on the second contact surface, wherein the rotation support portion includes a third ball, a relative position of the third ball with respect to the chamber is fixed, and a relative position of the third ball with respect to the mounting table is fixed, and the rotation support portion is intersected by both a first virtual plane, which passes through the first ball and is parallel to both a direction perpendicular to the first contact surface and the first direction, and a second virtual plane, which passes through the second ball and is parallel to both a direction perpendicular to the second contact surface and the second direction.

19. An electronic device manufacturing method, comprising:

inspecting a defect of a mask by irradiating the mask with extreme ultraviolet light generated by an extreme ultraviolet light generation apparatus;

selecting a mask using a result of the inspection; and exposing and transferring a pattern formed on the selected mask onto a photosensitive substrate, the extreme ultraviolet light generation apparatus including:

a chamber;

a target supply device configured to supply a target to a predetermined region in the chamber; and a tilt stage, the tilt stage including:

a mounting table on which the target supply device is mounted;

a rotation support portion configured to support the mounting table rotatably about at least first and second axes;

a first tilt support portion including a first ball and a first contact surface in contact with the first ball and supporting the mounting table;

a first adjuster configured to adjust posture of the target supply device by moving one of the first ball and the first contact surface in a first direction that is different from both a direction perpendicular to the first contact surface and a direction parallel to the first contact surface so that the first ball rolls on the first contact surface;

a second tilt support portion including a second ball and a second contact surface in contact with the second ball and supporting the mounting table; and a second adjuster configured to adjust the posture of the target supply device by moving one of the second ball and the second contact surface in a second direction that is different from both a direction perpendicular to the second contact surface and a direction parallel to the second contact surface so that the second ball rolls on the second contact surface, wherein the rotation support portion includes a third ball, a relative position of the third ball with respect to the chamber is fixed, and a relative position of the third ball with respect to the mounting table is fixed, and the rotation support portion is intersected by both a first virtual plane, which passes through the first ball and is parallel to both a direction perpendicular to the first contact surface and the first direction, and a second virtual plane, which passes through the second ball and is parallel to both a direction perpendicular to the second contact surface and the second direction.

* * * * *